(12) United States Patent
Choi et al.

(10) Patent No.: US 7,932,766 B2
(45) Date of Patent: Apr. 26, 2011

(54) DIGITALLY CONTROLLED OSCILLATOR WITH THE WIDE OPERATION RANGE

(75) Inventors: Kwang Hee Choi, Pohang-si (KR); Hong June Park, Pohang-si (KR)

(73) Assignees: Postech Foundation, Pohang-si (KR); Postech Academy-Industry Foundation, Pohang-si (KR)

( * ) Notice: Subject to any disclaimer, the term of this patent is extended or adjusted under 35 U.S.C. 154(b) by 80 days.

(21) Appl. No.: 12/364,173

(22) Filed: Feb. 2, 2009

(65) Prior Publication Data

US 2010/0127747 A1    May 27, 2010

(30) Foreign Application Priority Data

Oct. 30, 2008  (KR) .................. 10-2008-0106937

(51) Int. Cl.
*H03H 11/26* (2006.01)
(52) U.S. Cl. ........................................ 327/276
(58) Field of Classification Search .................. None
See application file for complete search history.

(56) References Cited

U.S. PATENT DOCUMENTS

| | | | | |
|---|---|---|---|---|
| 5,552,726 A * | 9/1996 | Wichman et al. | ............... | 327/149 |
| 5,712,582 A * | 1/1998 | Yokota et al. | ................. | 327/156 |
| 7,119,596 B2 * | 10/2006 | Kong et al. | .................... | 327/261 |
| 7,839,179 B2 * | 11/2010 | Lee | ................................ | 327/12 |
| 2008/0088349 A1 * | 4/2008 | Lee | .............................. | 327/158 |

* cited by examiner

*Primary Examiner* — Lincoln Donovan
*Assistant Examiner* — Khareem E Almo
(74) *Attorney, Agent, or Firm* — Kile Park Goekjian Reed & McManus PLLC

(57) ABSTRACT

There is provided a digitally controlled oscillator, which is capable of widening its operation range with maintaining its resolution and the maximum frequency at which it operates. The digitally controlled oscillator includes a phase compensation block, a coarse block, and a fine block. The phase compensation block 510 generating a PLL signal PLLCLK and a first clock signal CLK1 which has the same phase and frequency as the PLL signal, in response to a phase control signal DISABLE and a fourth clock signal CLK4. The coarse block 520 generating a second clock signal CLK2 and a third clock signal CLK3 which results from delaying the PLL signal PLLCLK and the first clock signal CLK1 for a given time, in response to a m(integer)-bit coarse A control signal COAR_A and an (m-1)-bit coarse B control signal COAR_B. The fine block generating the fourth clock signal CLK4 by applying interpolation to the second clock signal CLK2 and the third clock signal CLK3 in response to an n(integer)-bit first fine control signal FCB and a n-bit second fine control signal FC.

10 Claims, 11 Drawing Sheets

| COARSE CONTROL CODE | ODD-NUMBER MULTIPLE DELAY CHAIN BLOCK | | EVEN-NUMBER MULTIPLE DELAY CHAIN BLOCK | |
|---|---|---|---|---|
| | COAR_A IS ACTIVE | DELAY TIME | COAR_B IS ACTIVE | DELAY TIME |
| 0 | ALL BITS ARE NON-ACTIVE | 1TDinv | ALL BITS ARE NON-ACTIVE | 2TDinv |
| 1 | CA[0] | 3TDinv | ALL BITS ARE NON-ACTIVE | 2TDinv |
| 2 | CA[0] | 3TDinv | CB[0] | 4TDinv |
| 3 | CA[0], CA[1] | 5TDinv | CB[0] | 4TDinv |
| 4 | CA[0], CA[1] | 5TDinv | CB[0], CB[1] | 6TDinv |
| 5 | CA[0], CA[1], CA[2] | 7TDinv | CB[0], CB[1] | 6TDinv |
| 6 | CA[0], CA[1], CA[2] | 7TDinv | CB[0], CB[1], CB[2] | 8TDinv |
| ... | ... | ... | ... | ... |

Fig. 15

DIGITALLY CONTROLLED OSCILLATOR WITH THE WIDE OPERATION RANGE

BACKGROUND OF THE INVENTION

1. Field of the Invention

The present invention relates to a digitally controlled oscillator, and more particularly to a digitally controlled oscillator, which is capable of widening its operation range with maintaining its resolution and the maximum frequency at which it operates.

2. Description of the Background Art

An advance in semiconductor processing technology and an increasing number of systems which require a relatively small amount of power to operate encourage active research aimed at the substitution of an all digital phase locked loop for an analog phase locked loop. The all digital phase locked loop is required to widen its operation range, because the phase locked loop is used as a function block for supplying a clock signal to the system.

Generally, a digitally controlled oscillator, built in the digital phase locked loop, determines the range in which the digital phase locked loop operates. The digitally controlled oscillator includes a delay stage including odd-number inverters which connect in series to each other. The digitally controlled oscillator generates an oscillation signal by feeding back a delay signal output from the delay stage into the delay stage. A phase and a frequency of the oscillation signal can be adjusted by adjusting a delay time in the delay stage, using a digital control signal.

FIG. 1 is a view of an embodiment of a conventional digitally controlled oscillator.

Referring to FIG. 1, the digitally controlled oscillator 100 includes odd-number delay stages 110 through 130. Each of the delay stages 110 through 130 has tri-state inverters which connect in parallel to each other. The delay time in each of the delay stages is determined by adjusting the number of the tri-state inverters which operate among the tri-state inverters which connects in parallel to each other. An output from the third delay stage 130 is fed back into the first delay stage 110 to generate the oscillation signal.

FIG. 2 is a view of another embodiment of the conventional digitally controlled oscillator.

As shown in FIG. 2, the digitally controlled oscillator 200 includes coarse blocks 210 and 220 and a fine block 230.

The coarse blocks 210 and 220 includes the delay stage 210 and a multiplexer 220. The delay stage 210 includes a plurality of delay components 211 through 214. The multiplexer 220 selects one from among a plurality of delay signals, each having a different delay time, which are output from the delay stage 210, in response to an m (integer)-bit first control signal CON1. The fine block 230 reverses and delay a phase of the delay signal which is output from the multiplexer 220 in response to an n(integer)-bit second control signal CON2, and then feed back the phase-reversed and time-delayed delay signal into the delay stage 210.

Each of the delay components 211 through 214 generally includes a buffer which consists of two inverters connecting in series to each other. In this case, a minimum fluctuation unit of the delay time in the coarse blocks 210 and 220 is twice the delay time in the buffer, i.e., the delay time in the inverter.

In the fine block 230, the delay time is finely adjusted by changing a configuration of a circuit in response to the n-bit second control signal CON2. The adjustable delay time in the fine block 230 should be larger than, or equal to the minimum fluctuation unit of the delay time in the coarse blocks 210 and 220. Therefore, the adjustable delay time in the fine block 230 is more than two times, or equal to the delay time in the buffer, i.e. the delay time in the inverter.

FIG. 3 is a view of another embodiment of the conventional digitally controlled oscillator.

As shown in FIG. 3, the digitally controlled oscillator 300 includes a digital-to-analog converter 310 and a voltage controlled oscillator 320. The digitally controlled oscillator 300 uses the analog-type voltage controlled oscillator 320.

The three types of the conventional digitally controlled oscillator shown in FIGS. 1 through 3, when their operation range is widened, generally tend to operates at a low frequency.

In the digitally controlled oscillator 100 shown in FIG. 1, when the number of the tri-state inverters connecting in parallel to each other, making up the delay stage, is increased to widen its operation range, load capacitance of each delay stage is also increased. Thus, the maximum frequency at which the digitally controlled oscillator 100 decreases. In the digitally controlled oscillator 200 shown in FIG. 2, when the number of delay stage 210 making up the coarse block 210 and 220 is increased to widen its operation range, a fan-in value of the multiplexer 220 increases. Thus, the delay time in the multiplexer 220 increases. In the digitally controlled oscillator 300 shown in FIG. 3, when the operation range of the voltage controlled oscillator is increased to widen its operation range, the frequency at which the digitally controlled oscillator 300 decreases due to characteristics of the circuit.

BRIEF DESCRIPTION OF THE INVENTION

Therefore, an object of the present invention is provide a digitally controlled oscillator, capable of maintaining the maximum frequency at which it operates regardless of its operation range, with resolution being maintained.

According to an aspect of the present invention, there is provided a digitally controlled oscillator including a phase compensation block, a coarse block and a fine block. The phase compensation block generates a PLL signal and a first clock signal which has the same phase and frequency as the PLL signal, in response to a phase control signal and a fourth clock signal. The coarse block generates a second clock signal and a third clock signal which results from delaying the PLL signal and the first clock signal for a given time, in response to a m(integer)-bit coarse A control signal and an (m−1)-bit coarse B control signal. The fine block generates the fourth clock signal by applying interpolation to the second clock signal and the third clock signal in response to an n(integer)-bit first fine control signal and an n-bit second fine control signal, The digitally controlled oscillator according to the present invention provides an advantage of maintaining the maximum frequency at which it operates, regardless of its operation range, with resolution being maintained.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 15 is a table showing the delay time in the odd-number multiple delay chain block and the even-number multiple delay chain block according to the coarse control code.

DETAILED DESCRIPTION OF THE INVENTION

Reference will now be made in detail to an embodiment of the present invention, an example of which is illustrated in the accompanying drawings.

A digitally controlled oscillator according to the present invention uses interpolation to maintain the maximum frequency at which it operates regardless of its operation range, with resolution being maintained. For better understanding of the present invention, the interpolation is now described.

Figure 1:
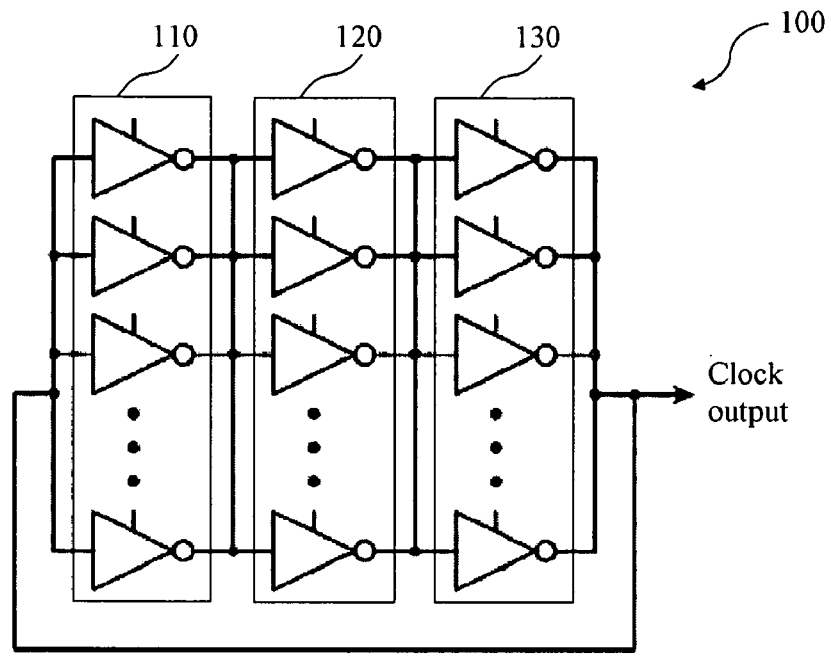
FIG. 1 is a view of an embodiment of a conventional digitally controlled oscillator.
Figure 2:
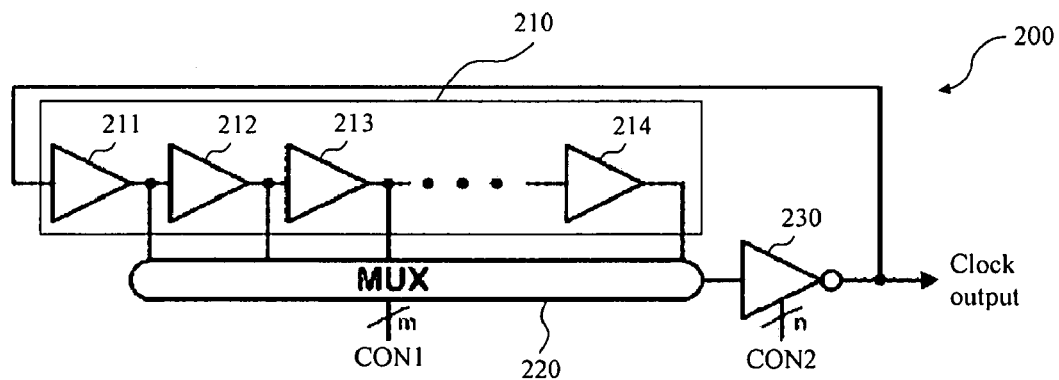
FIG. 2 is a view of another embodiment of the conventional digitally controlled oscillator.
Figure 3:
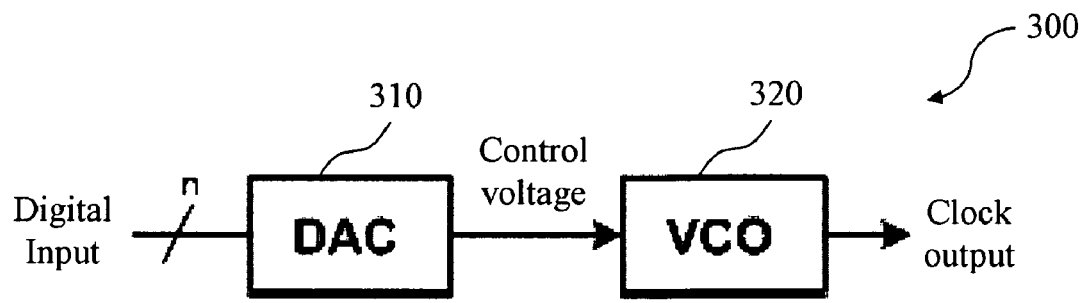
FIG. 3 is a view of another embodiment of the conventional digitally controlled oscillator.
Figure 4:
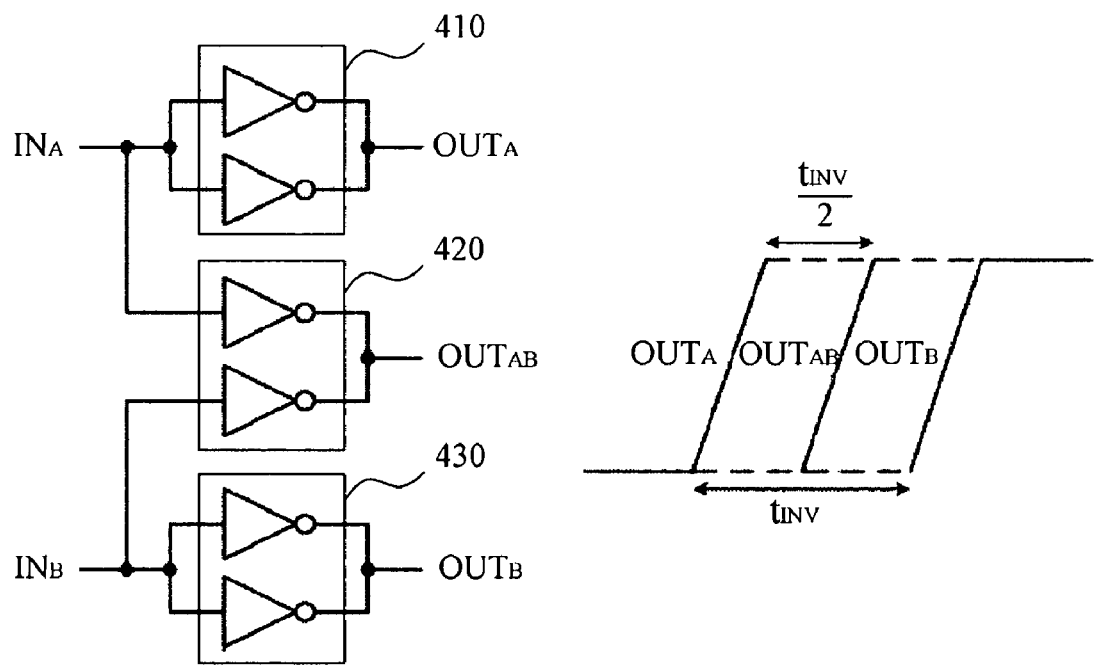
FIG. 4 is a view of a circuit and a waveform which help describing the interpolation used in the present invention.

FIG. 4 is a view of a circuit and a waveform which help describing the interpolation used in the present invention.

Referring to FIG. 4, two input signals $IN_B$, and $IN_A$ are input into a circuit and three output signals $OUT_A$, $OUT_{AB}$, and $OUT_B$ are output from the circuit. The second input signal $IN_B$ has the same phase as the first input signal $IN_A$, but is delayed by a delay time $t_{INV}$. The two input signals $IN_B$, $IN_A$ are input into the circuits 410 and 430, each having two inverters connecting in parallel to each other and the two output signals $OUT_A$, and $OUT_B$ are output from the circuits 410 and 430. Assume that the inverters in FIG. 4 have the same electric characteristics. Then, a time interval between the two output signals $OUT_A$ and $OUT_B$ output from the circuits 410 and 430 is the same as the delay time $t_{INV}$.

An output signal $OUT_{AB}$ results from connecting signals output from the inverters 420 into which the two input signals $IN_B$ and $IN_A$ are input. The output signal $OUT_{AB}$ is later than the first output signal $OUT_A$, one of the two output signals $OUT_A$, and $OUT_B$ output from the inverters 420 which connects in parallel to each other, by half of the delay time $$\frac{t_{INV}}{2},$$

and faster than the second output signal $OUT_B$, by half of the delay time $$\frac{t_{INV}}{2}.$$

In this manner, the interpolation is used in generating a signal having the phase difference which is approximately a half of the phase difference between two input signals which are out of phase with each other.

The use of the interpolation makes it possible to adjust the delay time in the delay stage, thereby reducing the fluctuation unit of the minimum delay time.

An invention idea of using interpolation in the digitally controlled oscillator now is explained.

The digitally controlled oscillator includes the coarse block and the fine block to widen its operation range. The maximum frequency at which the digitally controlled oscillator operates is the reciprocal of two times the sum of the minimum delay time in the coarse block and the minimum delay time in the fine block. Therefore, the delay time in the coarse block and the delay time in the fine block have to be minimized to maintain the maximum frequency at which the digitally controlled oscillator operates.

Generally, an output from the coarse block is transmitted to the fine block through the multiplexer. Thus, as the operation range of the coarse block increases, the delay in the multiplexer increases, thereby increasing the minimum delay time in the coarse block. Therefore, configuration of the tri-state inverters in the shape of a ladder in the coarse block makes it possible to maintain constant loading capacitance values of the all nodes in the coarse block regardless of the operation range of the coarse block, and at the same time to remove the need of using the multiplexer. This results in minimizing the delay time in the coarse block regardless of the operation range of the coarse block.

Also, application of interpolation to the ladder-shaped coarse block makes it possible to reduce the fluctuation unit of the minimum delay time in the coarse block by half. This results in reducing the range of delay time in the fine block, which is subject to fluctuation, thereby reducing the minimum delay time in the fine block. This leads to increase the maximum frequency at which the digitally controlled oscillator operates.

Figure 5:
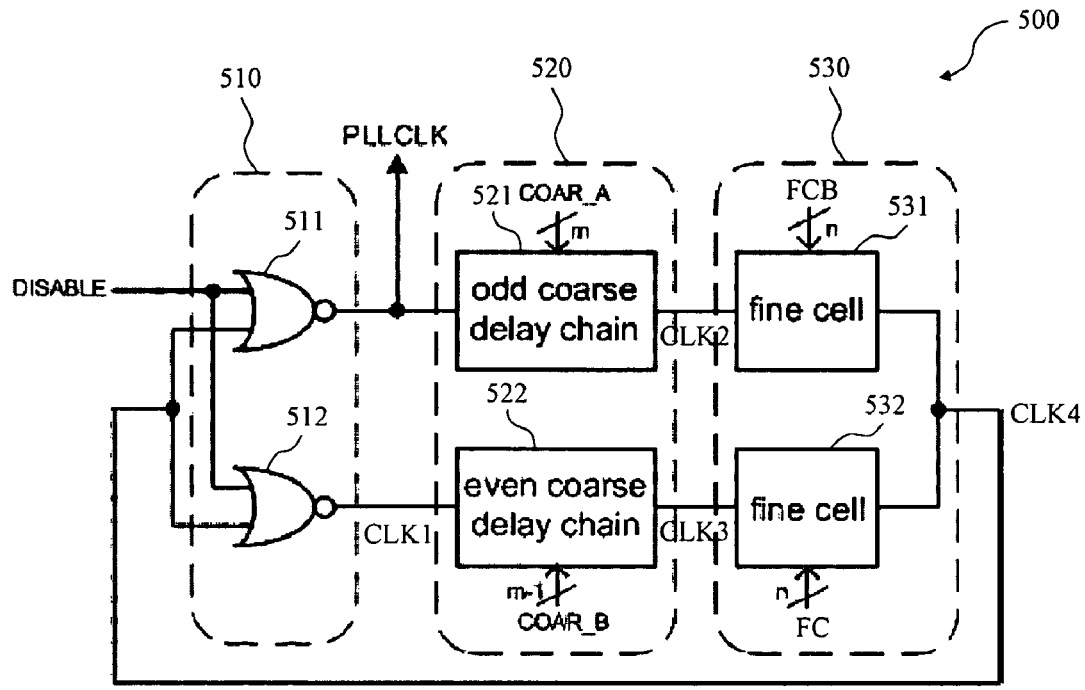
FIG. 5 is a block diagram of the digitally controlled oscillator according to the present invention.

FIG. 5 is a block diagram of the digitally controlled oscillator according to the present invention.

As shown in FIG. 5, the digitally controlled oscillator 500 includes the phase compensation block 510, the coarse block 520, and the fine block 530.

The phase compensation block 510 includes a first NOR gate 511 and a second NOR gate 512. The first NOR gates 511 generates a PLL signal PLLCLK, in response to a phase control signal DISABLE and a fourth clock signal CLK4 output from the fine block 530. The second NOR gates 512 generates a first clock signal CLK1 having the same phase and frequency as the PLL signal PLLCLK, in response to the phase control signal DISABLE and the fourth clock signal CLK4 output from the fine block 530. The first NOR gate 511 performs a NOR operation on the phase control signal DISABLE and the fourth clock signal CLK4 to generate the PLL signal PLLCLK. The second NOR gate 512 performs a NOR operation on the phase control signal DISABLE and the fourth clock signal CLK4 to generate the first clock signal CLK1.

The coarse block 520 includes an odd-number multiple delay chain block 521 and an even-number multiple delay chain block 522. The odd-number multiple delay chain block 521 generates a second clock signal CLK2 which results from delaying the PLL signal PLLCLK for a given time in response to an m(integer)-bit coarse A control signal COAR_A. The even-number multiple delay chain block 522 generates a third clock signal CLK3 which results from applying interpolation to a first clock signal CLK1 in response to a (m−1)-bit coarse B control signal COAR_B. The third clock signal CLK3 is a signal which is obtained by adding even number times the unit delay time to the first clock signal CLK1.

The unit delay time is determined by electric characteristics of a delay device making up the odd-number multiple delay chain block 521 and the even-number delay chain block 522. The delay device delays an input signal for a given time. The unit delay time is later described.

The fine block 530 includes a first fine adjustment delay block 531 and a second fine adjustment block 532. The first fine adjustment delay block 531 and the second fine adjustment delay block 532 apply interpolation to the second clock signal CLK2 and the third clock signal CLK3, in response to an n(integer)-bit first fine control signal FCB and an n(integer)-bit second fine control signal FC, respectively, to generate the fourth clock signal CLK4.

The first fine adjustment delay block 531 delays the second clock signal CLK2 for a given time, in response to the first fine control signal FCB. The second fine adjustment delay block 532 delays the third clock signal CLK3 for a given time, in response to the second fine control signal FC. At this point, output terminals of the first and second fine adjustment delay blocks 531 and 532 connect to each other to generate the fourth clock signal CLK4. The fourth clock signal CLK4 is a signal that results from applying interpolation to the second and third clock signals CLK2 and CLK3 which are delayed for the given time. Description of the interpolation is above described referring to FIG. 4.

Components and circuits are now described which make up the digitally controlled oscillator according to the present invention, as shown in FIG. 5.

Figure 6:
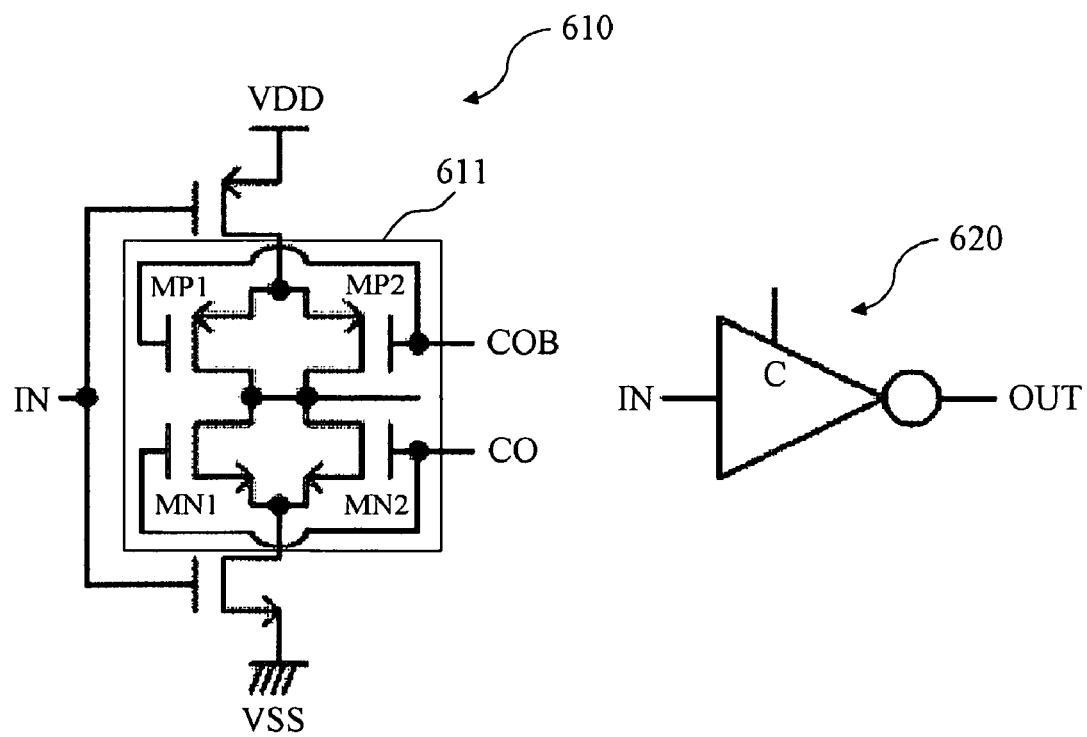
FIG. 6 is a view of a circuit and a symbol of a first type tri-state inverter used in the digitally controlled oscillator according to the present invention.

FIG. 6 is a view of a circuit and a symbol of a first type tri-state inverter used in the digitally controlled oscillator according to the present invention.

As shown in FIG. 6, the first-type tri-state inverter includes two inverting transistors MPO and MNO and a delay adjustment unit 611.

One terminal of the P-type inverting transistor MPO connects to a first power source voltage VDD and an input signal IN is applied to a gate terminal. One terminal of the N-type inverting transistor MNO connects to a second power source voltage VSS and the input signal IN is applied to a gate.

The delay adjustment unit 611 includes four(4) delay adjustment transistors MP1, MP2, MN1, and MN2. The four delay adjustment transistors connect between the other terminal of the P-type inverting transistor MPO and the other terminal of the N-type inverting transistor MNO. The four delay adjustment transistors adjust the delay time in the first type tri-state inverter and operate in response to a 0 th control signal C0 and a 0 th reverse control signal C0B.

One terminal of the first P-type delay adjustment transistor MP1 connects to the other terminal of the P-type inverting transistor MPO. The other terminal of the first P-type delay adjustment transistor MP1 connects to an output terminal outputting an output signal OUT, and the 0 th reverse control signal C0B is applied to a gate. One terminal of the second P-type delay adjustment transistor MP2 connects to the other terminal of the P-type inverting transistor MPO. The other terminal of the second P-type delay adjustment transistor MP2 connects to the output terminal outputting the output signal OUT, and the 0 th reverse control signal C0B is applied to a gate.

One terminal of the first N-type delay adjustment transistor MN1 connects to the other terminal of the N-type inverting transistor MNO. The other terminal of the first N-type delay adjustment transistor MN1 connects to the output terminal outputting the output signal OUT, and the 0 th control signal C0 is applied to a gate. One terminal of the second N-type delay adjustment transistor MN2 connects to the other terminal of the N-type inverting transistor MNO. The other terminal of the second N-type delay adjustment transistor MN2 connects to the output terminal outputting the output signal OUT, and the 0 th control signal C is applied to a gate.

The 0 th reverse control signal C0B has the same amplitude as the 0 th control signal C0, but has the opposite phase to the 0 th control signal C0. For example, when the 0 th reverse control signal C0B has a voltage level which is equal to or close to the second power source voltage VSS, the 0 th control signal C0 has a voltage level which is equal to or close to the first power source voltage VDD. In this case, all the four delay adjustment transistors MP1, MP2, MN1, and MN2 turn on, so the first type tri-state inverter 610 works normally. When the 0 th control signal C0 has a voltage level which is equal to or close to a ground voltage GND, all the four delay adjustment transistors MP1, MP2, MN1, and MN2 turn off, so an output from the first type tri-state inverter 610 maintains the previous voltage level.

The four transistors are referred to as the delay adjustment transistors. This is because the two P-type transistors MP1 and MP2 connecting in parallel to each other and the two N-type transistor MN1 and MN2 connecting in parallel to each other connect in series to each other to adjust the delay time in the first type tri-state inverter 610.

A reference numeral 620 indicates a symbol of the first type tri-state inverter.

The first power source voltage VDD has a relatively higher voltage level, compared with the second power source voltage, and the second power source voltage VSS can be replaced with the ground voltage GND.

Figure 7:
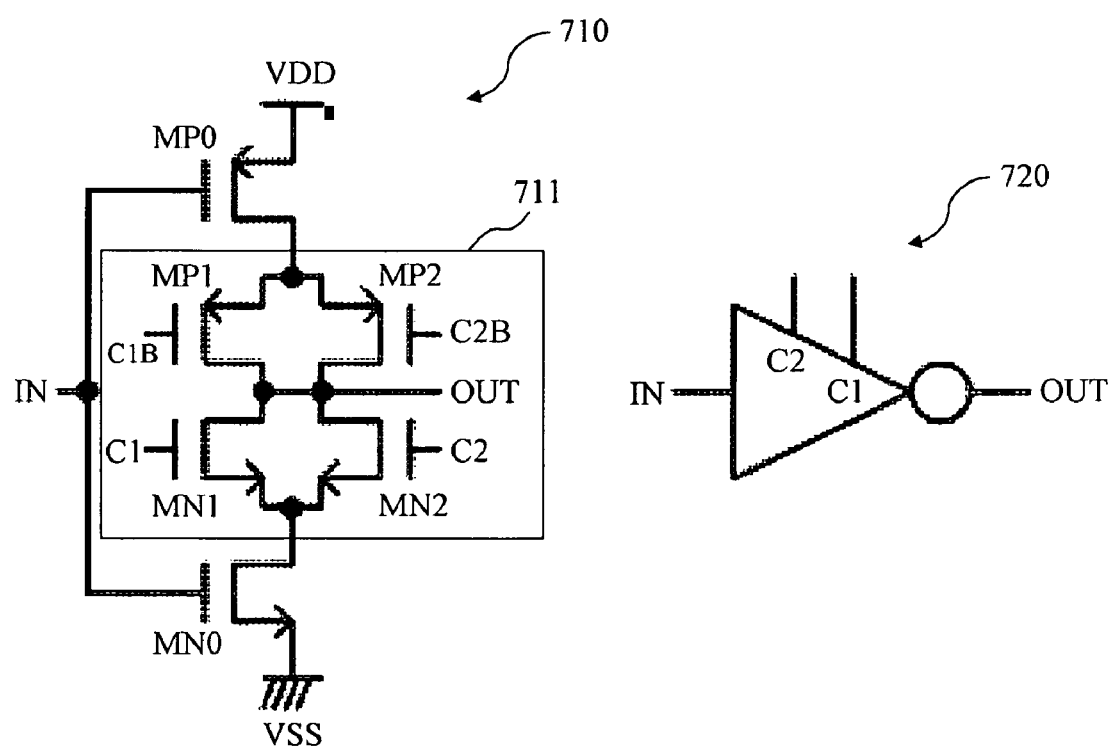
FIG. 7 is a view of a circuit and a symbol of a second type tri-state inverter which is used in the digitally controlled oscillator according to the present invention.

FIG. 7 is a view of a circuit and a symbol of a second type tri-state inverter which is used in the digitally controlled oscillator according to the present invention.

As shown FIG. 7, the second type tri-state inverter includes a delay adjustment unit 711 including two inverting transistors MPO and MNO, and four delay adjustment transistors MP1, MP2, MN1, and MN2.

What distinguishes the second type tri-state inverter 710 as shown in FIG. 7, from the first type tri-state inverter 610 as shown in FIG. 6 is that two different reverse control signal C1B and C2B are applied to the gates of the two P-type delay adjustment transistors MP1 and MP2 connecting in parallel to each other and two different control signals C1 and C2 are applied to the gates of the two N-type delay adjustment transistors MN1 and MN2 connecting in parallel to each other.

The first reverse control signal C1B has the same amplitude as the first control signal C1, but the opposite phase to the first control signal C1. The second reverse control signal C2B has the same amplitude as the second control signal C2, but the opposite phase to the second control signal C2. When the first and second control signals C1 and C2 have a voltage level which is equal to or close to the first power source voltage VDD and when the first and second control signals C1 and C2 have a voltage level which is equal to or close to the second power source voltage the first and second control signals C1 and C2 has the same electric characteristics as the first type tri-state inverter 610 as shown in FIG. 6.

However, when only one signal of the first and second control signals C1 and C2 has a voltage level which is equal to or close to the first power source voltage VDD or the second power source voltage VSS, the delay time changes. That is, the delay time for the input signal is greater when one transistor of the two delay adjustment transistors connecting in parallel to each other turns on than it is when all the two delay adjustment transistors connecting in parallel to each other turn on. Thus, what distinguishes the second type tri-state inverter 710 from the first type tri-state inverter 610 is that in the second type tri-state inverter 710, the delay time can be adjusted by adjusting the first and second control signals C1 and C2.

The reference numeral 720 indicates a symbol of the second type tri-state inverter.

Figure 8:
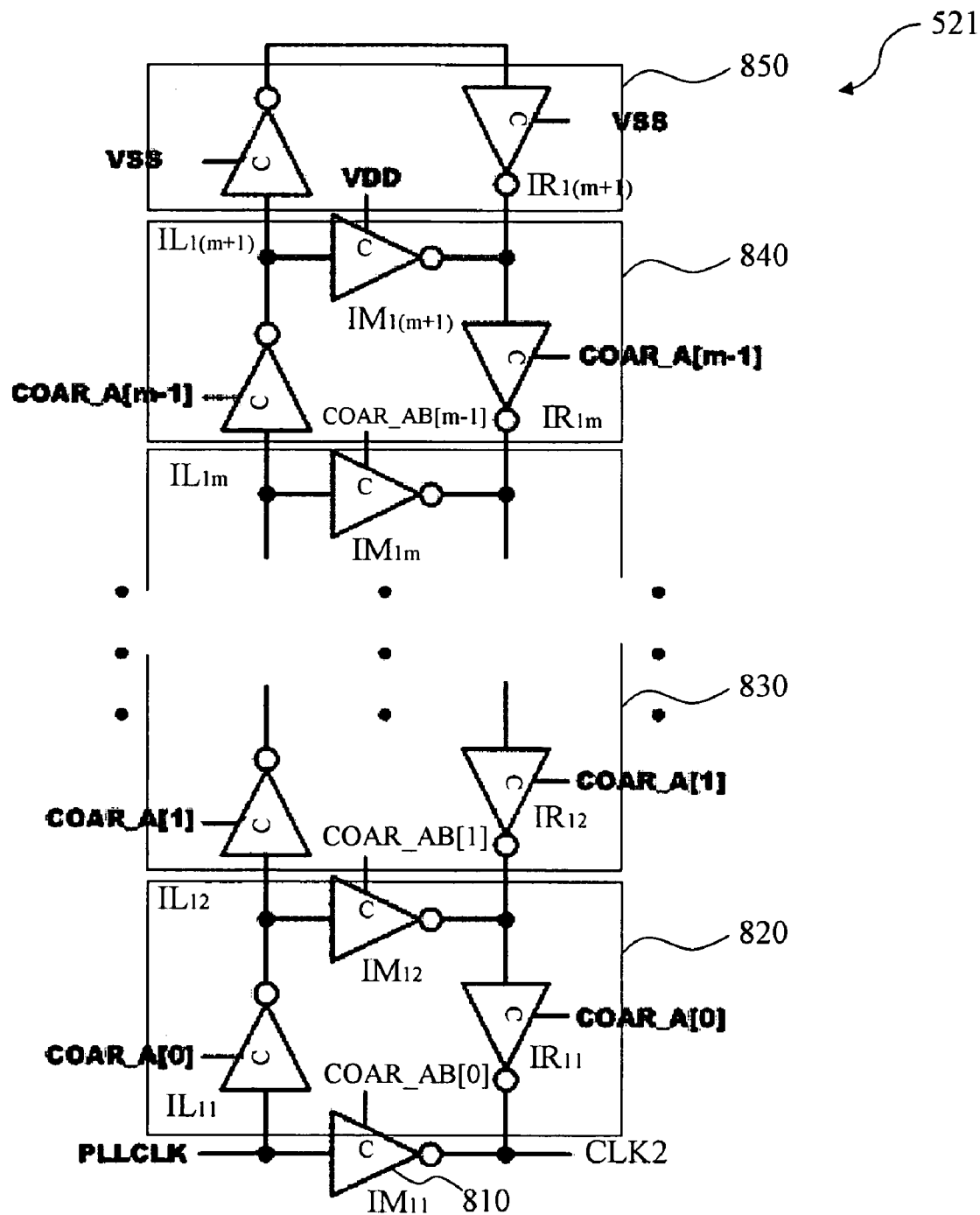
FIG. 8 is a view of a circuit of the odd-number multiple delay chain block shown in FIG. 5.

FIG. 8 is a view of a circuit of the odd-number multiple delay chain block shown in FIG. 5.

As shown in FIG. 8, the odd-number multiple delay chain block 521 includes a first intermediate inverter 810 $IM_{11}$, a first odd-number multiple delay chain circuit 820, a second odd-number multiple delay chain circuit 830, an m th odd-number multiple delay chain circuit 840, and a closing delay chain circuit 850.

The first intermediate inverter $IM_{11}$ is provided between a terminal receiving the PLL signal PLLCLK and a terminal outputting the second clock signal CLK2.

The first odd-number multiple delay chain circuit 820 includes a first left inverter $IL_{11}$, a second intermediate inverter $IM_{12}$ and a first right inverter $IR_{11}$ which connect in series to each other between the input and output terminals of the first intermediate inverter $IM_{11}$.

The second odd-number multiple delay chain circuit 830 includes a second left inverter $IL_{12}$, a third intermediate inverter (not shown) $IM_{13}$ and a second right inverter $IR_{12}$ which connect in series to each other between the input and output terminals of the second intermediate inverter $IM_{12}$.

The m th odd-number multiple delay chain circuit 840 includes an m th left inverter $IL_{1m}$, an (m+1) th intermediate inverter $IM_{1(m+1)}$ and an m th right inverter $IR_{1m}$ which connect in series to each other between the input and output terminals of the m th intermediate inverter $IM_{1m}$.

The closing delay chain circuit 850 includes an (m+1)th left inverter $IL_{1(m+1)}$ and an (m+1)th right inverter $IR_{1(m+1)}$ which connect in series to each other between the input and output terminals of an (m+1) th intermediate inverter $IM_{1(m+1)}$.

When m=1, the m th odd-number multiple delay chain circuit 840 is the first odd-number multiple delay chain circuit 820. When m=2, the m th odd-number multiple delay chain circuit 840 is the second odd-number multiple delay chain circuit 830.

The first type tri-state inverter as shown in FIG. 6 is used as the odd-number multiple delay chain block as shown in FIG. 8. The first type tri-state inverter operates in response to one control signal.

The m th intermediate inverter $IM_{1m}$ operates in response to an (m−1)th coarse A reverse control signal COAR_AB[m−1]. For example, the first intermediate inverter $IM_{11}$ operates in response to the 0 th coarse A reverse control signal COAR_AB[0], and the second intermediate inverter $IM_{12}$ operates in response to a first coarse A reverse control signal COAR_AB[1].

The m th left inverter $IL_{1m}$ operates in response to an (m−1)th coarse A control signal COAR_A[m−1]. For example, the first left inverter $IL_{11}$ operates in response to a 0 th coarse A control signal COAR_A[0], and the second left inverter $IL_{12}$ operates in response to a first coarse A control signal COAR_A[1].

The m th right inverter $IR_{1m}$ operates in response to the (m−1)th coarse A control signal COAR_A[m−1]. For example, the first right inverter $IR_{11}$ operates in response to a 0 th coarse A control signal COAR_A[0], and the second right inverter $IR_{12}$ operates in response to the first coarse A control signal COAR_A[1].

The (m+1) th intermediate inverter $IM_{1(m+1)}$ making up the m th odd-number multiple delay chain circuit 840 always turns on because the control signal has the first power source voltage VDD.

The (m+1)th left inverter $IL_{1(m+1)}$ and (m+1)th right inverter $IR_{1(m+1)}$, which make up the closing delay chain circuit 850, always turns off because the control signal has the second power source voltage VSS. Load balance between the delay chain circuits is maintained by connecting the (m+1) th left inverter $IL_{1(m+1)}$ and the (m+1) th right inverter $IR_{1(m+1)}$ which always turn on as above described, in parallel, to the (m+1)th intermediate inverter $IM_{1(m+1)}$.

Figure 9:
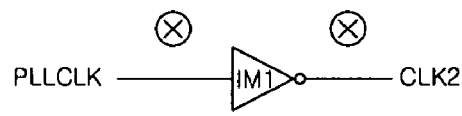
FIG. 9 is a view of a circuit of the odd-number multiple delay chain clock according to the coarse A control signal.
Figure 9:
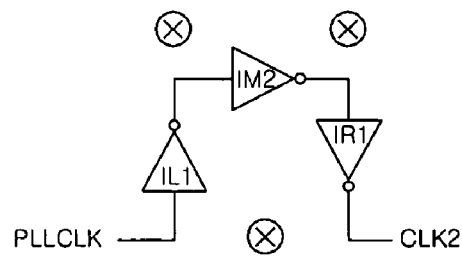
Figure 9:
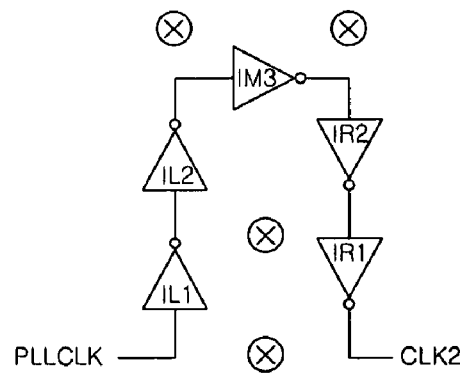
Figure 9:
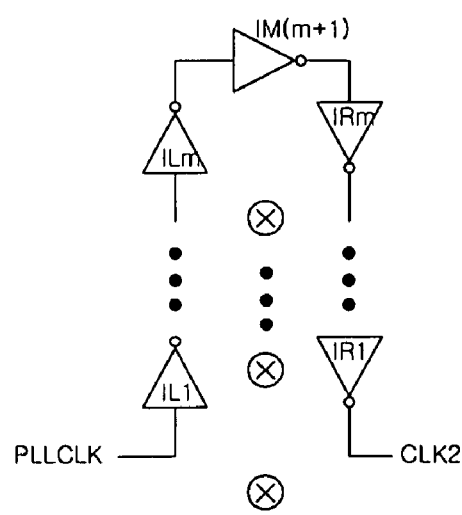

FIG. 9 is a view of a circuit of the odd-number multiple delay chain clock according to the coarse A control signal.

The circuit as shown at top in FIG. 9 shows that all coarse control signals are logically LOW ("0 (zero)"). At this point, the 0 th through (m−1)th coarse A reverse control signals COAR_AB[0] and COAR_AB[m−1] are logically HIGH ("1 (one)"). So, the first through m th intermediate inverters $IM_{11}$ and $IM_{1m}$ operate properly. However, the first left inverter $IL_{11}$ and the first right inverter $IR_{11}$ have high impedances because the 0 th coarse A control signal COAR_A[0] is logically LOW. So, the odd-number multiple delay chain block seen from two nodes PLLCLK and CLK2 takes the same shape as the circuit shown at top in FIG. 9. regardless of operations of the other tri-state inverters. In this case, the second clock signal CLK2 indicates that the delay time in one (odd-number multiple) first type tri-state inverter is included in the PLL signal PLLCLK.

The circuit as shown at the second row from top in FIG. 9 shows that only the 0th coarse A control signal COAR_A[0] is logically HIGH and the other coarse control signals are logically LOW. At this point, the first intermediate inverter $IM_{11}$ have high impedance, and the first left inverter $IL_{11}$, the second intermediate inverter $IM_{12}$ and the first right inverter $IR_{12}$ operate properly. The second left inverter $IL_{12}$ and the second right inverter $IR_{12}$ have high impedances, and have the same shape as the circuit as shown at the second row from tom in FIG. 9, regardless of operations of the other intermediate inverters. In this case, the second clock signal CLK2 indicates that the delay time in three (odd-number multiple) first type tri-state inverters is included in the PLL signal PLLCLK.

The circuit as shown at the third row from top in FIG. 9 shows that the 0 th coarse A control signal COAR_A[0] and the first coarse A control signal COAR_A[1] are logically HIGH and the other coarse A control signals are all logically LOW. In this case, the second clock signal CLK2 indicates that the delay time in five (odd-number multiple) first type tri-state inverters is included in the PLL signal PLLCLK.

The circuit as shown at bottom in FIG. 9 shows that the 0 th through (m−1) coarse A control signals COAR_A[0] and COAR_A[m−1] are all logically HIGH. In this case, the second clock signal CLK2 indicates that the delay time in (2m+1) (odd-number multiple) of the first type tri-state inverters is included in the PLL signal PLLCLK.

Referring to FIGS. 8 and 9, the odd-number inverters always connect properly between the two nodes PLLCLK and CLK2, depending upon the selected coarse A control signal value. This indicates that the second clock signal CLK2 output from the odd-number multiple delay chain block is a signal which results from adding odd-number times the delay time in the tri-state inverter to the input signal, i.e., the PLL signal PLLCLK.

In the delay chain block in which the tri-state inverters connects to each other in the shape of the ladder, there is somewhat a difference in load capacitance between the tri-state inverters arranged on the left sidepiece of the ladder and the tri-state inverters arranged on the right sidepiece of the ladder. So, there is somewhat a difference in the delay time between the tri-state inverters arranged on the left sidepiece of the ladder and the tri-state inverters arranged on the right sidepiece of the ladder and in the middle of the ladder. The delay time is $R_{ON}(2C_G+C_J)$ in the tri-state inverter on the left sidepiece of the ladder. The interval time is $R_{ON}(C_G+2C_J)$ in the tri-state inverter on the right sidepiece of the ladder and in the middle of the ladder. In the formula $R_{ON}(C_G+2C_J)$, $R_{ON}$ is a turn-on resistance value of the tri-state inverter, $C_G$ is an input gate capacitance value of the tri-state inverter, and $C_J$ is an output junction capacitance value of the tri-state inverter.

At this point, if the output node of the odd-number multiple delay chain block connects to the input of the tri-state inverter which has the same size as the tri-state inverter used in the odd-number multiple delay chain block, the delay time in the delay chain block is any one of $R_{ON}(C_G+2C_J)$, $R_{ON}(4C_G+5C_J)$, $R_{ON}(7C_G+8C_J)$, and $R_{ON}((3m+1)C_G+(3m+2)C_J)$. These delay times are not the exact odd-number multiple of the specific value, but the interval between the delay times is constant. Thus, the gist of the present invention remains unchanged.

Figure 10:
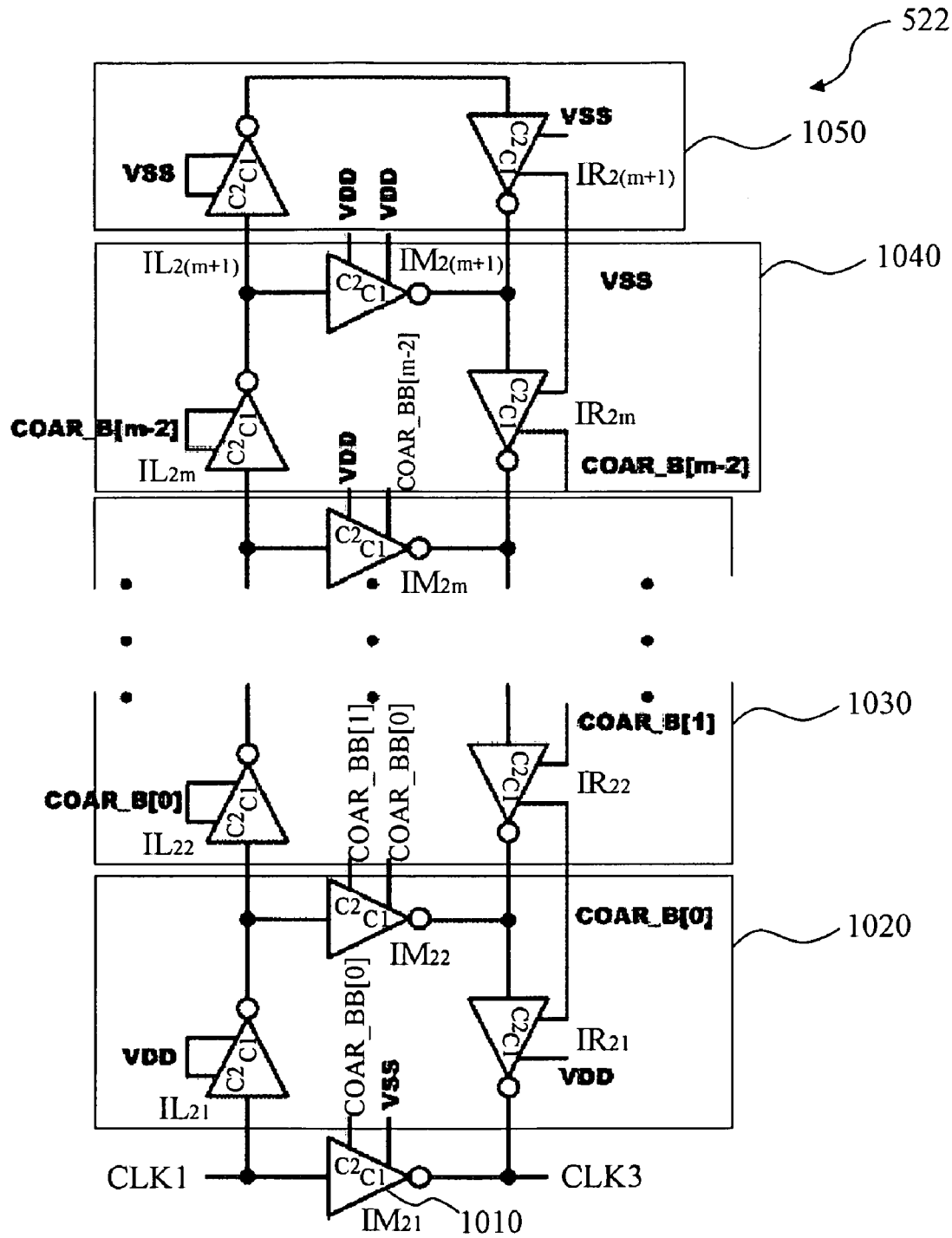
FIG. 10 is a view of a circuit of the even-number multiple delay chain block as shown in FIG. 5.

FIG. 10 is a view of a circuit of the even-number multiple delay chain block as shown in FIG. 5.

As shown in FIG. 10, the even-number multiple delay chain block 522 includes a first intermediate inverter 1010 $IM_{21}$, a first even-number multiple delay chain circuit 1020, a second even-number multiple delay chain circuit 1030, an m th even-number multiple delay chain circuit 1040, and a closing delay chain circuit 1050.

The first intermediate inverter 1010, $IM_{21}$ is provided between a terminal receiving the first clock signal CLK1 and a terminal outputting the third clock signal CLK3.

The first even-number multiple delay chain circuit 1020 includes a first left inverter $IL_{21}$, a second intermediate inverter $IM_{22}$ and a first right inverter $IR_{21}$ which connect in series to each other between the input and output terminals of the first intermediate inverter $IM_{21}$.

The second even-number multiple delay chain circuit 1030 includes a second left inverter $IL_{22}$, a third intermediate inverter $IM_{23}$ and a second right inverter $IR_{22}$ which connect in series to each other between the input and output terminals of the second intermediate inverter $IM_{22}$.

The m th even-number multiple delay chain circuit 1040 includes an m th left inverter $IL_{2m}$, an (m+1)th intermediate inverter $IM_{2(m+1)}$ and an m th right inverter $IR_{2m}$ which connect in series to each other between the input and output terminals of an m th intermediate inverter $IM_{2m}$.

The closing delay chain circuit 1050 includes an (m+1)th left inverter $IL_{2(m+1)}$ and an (m+1)th right inverter $IR_{2(m+1)}$ which connect in series to each other between the input and output terminals of an (m+1) th intermediate inverter $IM_{2(m+1)}$.

When m=1, the m th even-number multiple delay chain circuit 1040 is the first even-number multiple delay chain circuit 1020. When m=2, the m th even-number multiple delay chain circuit 1040 is the second odd-number multiple delay chain circuit 1030.

The second type tri-state inverter as shown in FIG. 7 is used as the even-number multiple delay chain block as shown in FIG. 10. The second type tri-state inverter operates in response to two control signals.

The first intermediate inverter 1010, $IM_{21}$ operates in response to the 0 th coarse B reverse control signal COAR_BB[0] and the second power source voltage VSS. The second intermediate inverter $IM_{22}$ operates in response to the first coarse B reverse control signal COAR_BB[1] and the 0 th coarse B reverse control signal COAR_BB[0]. An (m−1) intermediate inverter $IM_{2(m−1)}$ operates in response to an (m−2) th coarse B reverse control signal COAR_BB[m−2] and an (m−3) coarse B reverse control signal COAR_BB[m−3]. An m th intermediate inverter $IM_{2m}$, operates in response to the first power source voltage VDD and an (m−2) coarse B reverse control signal COAR_BB[m−2]. An (m+1) intermediate inverter $IM_{2(m+1)}$ operates in response to the first power source voltage VDD and the first power voltage VDD.

The two control signals are the same for the left inverter $IL_{21}$~$IL_{2(m+1)}$.

The first left inverter $IL_{21}$ operates in response to the first power source voltage VDD. The second through m th left inverters $IL_{22}$ through $IL_{2m}$ operate in response to the 0 th through (m−2) th coarse B control signals COAR_B[0] and COAR_B[m−2], respectively. An (m+1) left inverter $IL_{2(m+1)}$ operates in response to the second power source voltage VSS.

The first right inverter $IR_{21}$ operates in response to the first power source VDD and the 0 th coarse B control signal COAR_B[0]. The second right inverter $IR_{22}$ operates in response to the 0 th coarse B control signal COAR_B[0] and the first coarse B control signal COAR_B[1]. An (m−1)th right inverter $IR_{2(m−1)}$ operates in response to an (m−3)th coarse B control signal COAR_B[m−3] and an (m−2)coarse B control signal COAR_B[m−2]. An m th right inverter $IR_{2m}$ operates in response to an (m−2)th coarse B control signal COAR_B[m−2] and the second power source voltage VSS. An (m+1)th right inverter $IR_{2(m+1)}$ operates in response to the second power source VSS and the second power source VSS.

The (m+1) th intermediate inverter $IM_{2(m+1)}$ making up the m th even-number multiple delay chain circuit 1040 always turns on because the two control signals has the first power source voltage VDD. An (m+1)th left inverter $IL_{2(m+1)}$ and an (m+1)th right inverter $IR_{2(m+1)}$, which make up the closing delay chain circuit 1050, always turns off because the control signal has the second power source voltage VSS.

Load balance between the delay chain circuits is maintained by connecting the (m+1) th left inverter $IL_{2(m+1)}$ and the (m+1) th right inverter $IR_{2(m+1)}$ which always turn off, in parallel, to the (m+1)th intermediate inverter $IM_{2(m+1)}$.

Figure 11:
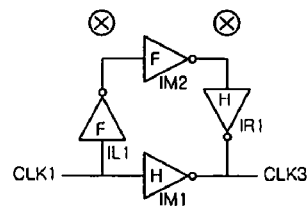
FIG. 11 is a view of a circuit of the even-number multiple delay chain block according to the coarse B control signal.
Figure 11:
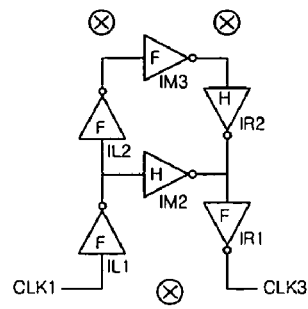
Figure 11:
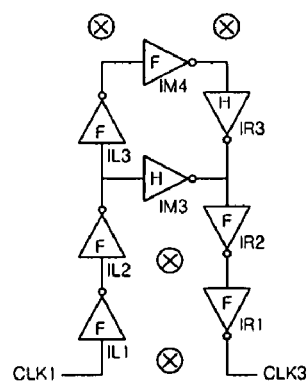
Figure 11:
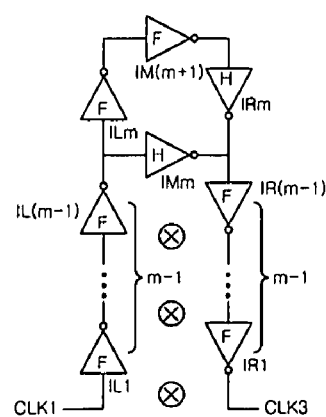

FIG. 11 is a view of a circuit of the even-number multiple delay chain block according to the coarse B control signal.

The circuit as shown at top in FIG. 11 shows that all coarse B control signals are logically LOW ("0 (zero)").

The first intermediate inverter $IM_{21}$ operates when the 0 th coarse B reverse control signal COAR_BB[0] is logically HIGH, and the second power source voltage VSS is logically LOW. The state that only one of the control signals is logically HIGH, like this, is defined as a half-turn-on state H. The state that the two control signals are all logically HIGH is defined as a fully-turn-on state F. The delay time in the first intermediate inverter $IM_{21}$ is larger in the state H than it is in the state F.

The first left inverter IL$_{21}$ is always in the fully-turn-on state F because it operates in response to the first power source VDD which is logically HIGH.

The second intermediate inverter IM$_{22}$ is in the state F because it operates in response to the 0 th coarse B reverse control signal COAR_BB[0] which is logically HIGH and the first coarse B reverse control signal COAR_BB[1] which is logically HIGH.

The first right inverter IR$_{21}$ is in the half-turn-on state H because it operates in response to the first power source voltage VDD which is logically HIGH and the 0th coarse B control signal COAR_B[0] which is logically LOW.

The second left inverter IL$_{22}$ operates in response to the 0th coarse B control signal COAR_B[0] which is logically LOW. The second right inverter IR$_{22}$ operates in response to the 0th B control signal COAR_B[0] which is logically LOW and the first coarse B control signal COAR_B[1] which is logically LOW. Thus, the second left and right inverters IL$_{22}$ and IR$_{22}$ are in the high impedance state X. This is true for the inverters which are positioned over the second left inverters IL$_{22}$ and over the second right inverter IR$_{22}$ in FIG. 10. The inverter in the high impedance state X does not operate.

Figure 12:
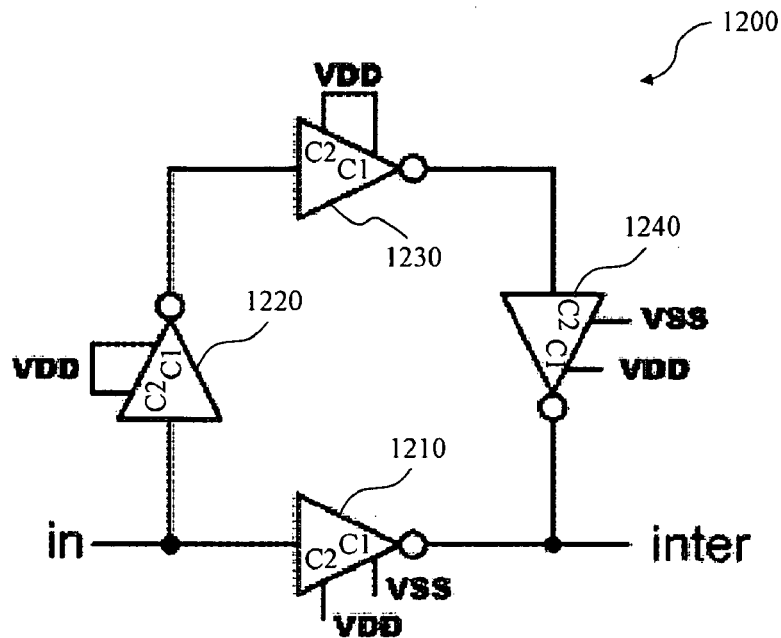
FIG. 12 is a view of part of a circuit of the even-number multiple delay chain block to which the interpolation is applied.

Therefore, when viewed from the two nodes CLK1 and CLK3, the three inverters IL$_{21}$, IM$_{22}$, and IR$_{21}$ connecting in series to each other connect in parallel, to each other. Referring to FIG. 12, a feature of this configuration is later described.

In a nutshell, the third clock signal CLK3 is a signal which results from adding two times (even-number multiple) the delay time in the second type tri-state inverters to the first clock signal CLK1.

The circuit as shown at the second row from top in FIG. 11 shows that only the 0 th coarse B control signal COAR_B[0] is logically HIGH and the other coarse control signals are logically LOW. So, the 0th coarse B reverse control signal COAR_BB[0] is logically LOW.

At this point, the first intermediate inverter IM$_{21}$ is in the high impedance state X because it operates in response to the 0th coarse B reverse control signal COAR_BB[0] which is logically LOW, and the second power source voltage VSS which is logically LOW.

The first left inverter IL$_{21}$ is always in the fully-turn-on state F. The first right inverter IR$_{21}$ is always in the fully-turn-on state F because it operates in response to the first power source voltage VDD which is logically HIGH and the 0th coarse B control signal COAR_B[0] which is logically HIGH. The second intermediate inverter IM$_{22}$ is in the half-turn-on state H because the first coarse B reverse control signal COAR_BB[1] which is logically HIGH and the 0 th coarse B reverse control signal COAR_BB[0] which is logically LOW.

The second inverter IL$_{22}$ is always in the fully-turn-on state F because it operates in response to the 0 th coarse B control signal COAR_B[0] which is logically HIGH. The third intermediate inverter IM$_{23}$ is in the fully-turn-on state F because it operates in response to the second coarse B control signal COAR_BB[2] which is logically HIGH, and the first coarse B reverse control signal COAR_BB[1] which is logically HIGH. The second right inverter IR$_{22}$ is in the half-turn-on state H because it operates in response to the 0th coarse B control signal COAR_B[0] which is logically HIGH and the first coarse B control signal COAR_B[1] which is logically LOW.

The third left inverter IL$_{23}$ operates in response to the second coarse B control signal COAR_B[2] which is logically LOW. The third right inverter IR$_{23}$ operates in response to the first coarse B control signal COAR_B[1] which is logically LOW and the second coarse B control signal COAR_B[2] which is logically LOW. Thus, the third left and right inverters IL$_{23}$ and IR$_{23}$ are all in the high impedance state X. This is true for the second type tri-state inverters which are positioned over the third left and right inverters IL$_{23}$ and IR$_{23}$.

In this configuration, the third clock signal CLK3 is a signal obtained by adding four times (even-number multiple) the delay time in the second type tri-state inverter to the first clock signal CLK1.

The circuit as shown at the third row from top in FIG. 11 shows that the 0th coarse B control signal COAR_B[0] and the first coarse B control signal COAR_B[1] are logically HIGH and the other coarse B control signals are all logically LOW. In this configuration, the third clock signal CLK3 is a signal obtained by adding six times (even-number multiple) the delay time in the second type tri-state inverter to the first clock signal CLK1.

The circuit as shown at bottom in FIG. 11 shows that the 0 th through (m−2)th coarse B control signals COAR_B[0] through COAR_B[m−2] are all logically HIGH. In this configuration, the third clock signal CLK3 is a signal which result from adding 2 m times (even-number multiple) the delay time in the second type tri-state inverter to the first clock signal CLK1.

Referring to FIGS. 10 and 11, the third clock signal CLK3 which is output from the even-number multiple delay chain block, depending upon the selected coarse B control signal value, is a signal which results from adding even-number times the delay time in the tri-state inverter to the input signal, i.e., the first clock signal CLK1.

FIG. 12 is a view of part of a circuit of the even-number multiple delay chain block to which the interpolation is applied.

As shown in FIG. 12, three second type tri-state inverters 1220 through 1240, which connect in series to one second type tri-state inverter 1210 between an input terminal (in) and an output terminal (out) connect in parallel, to each other.

The delay time per one second type tri-state inverter is defined as a unit delay time. The delay time in one inverter and the delay time in three inverters are odd-number times the unit delay time. Referring to FIG. 4, application of the interpolation to the output which is one time the unit delay time and the output which is three times the unit delay time results in generating two times the unit delay time. The interpolation is applied to the circuit as shown in FIGS. 10 and 11, thereby outputting even-number times the unit delay time.

Figure 13:
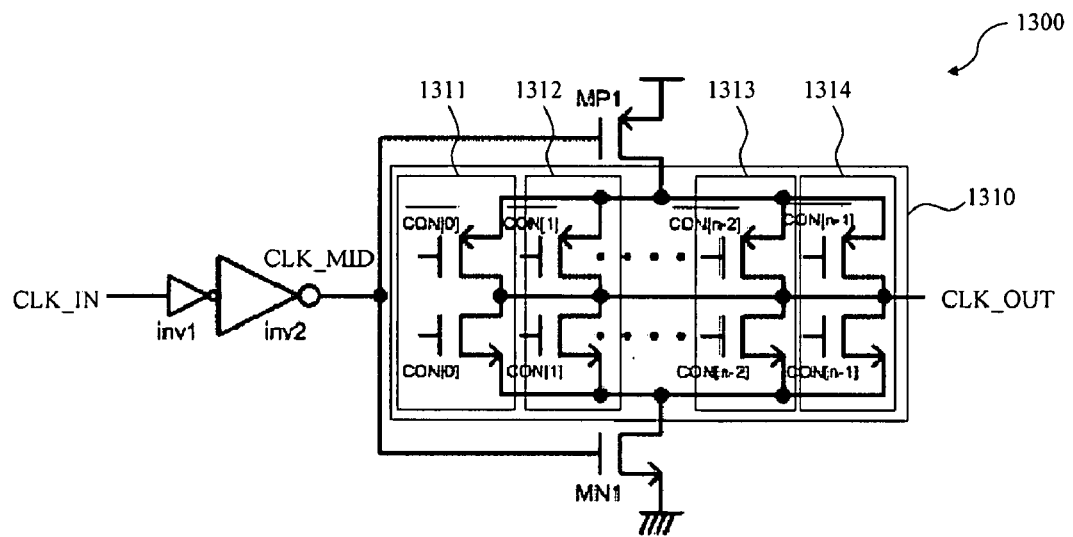
FIG. 13 is a view of the circuit of the fine adjustment delay block as shown in FIG. 5.

FIG. 13 is a view of the circuit of the fine adjustment delay block as shown in FIG. 5.

The fine adjustment delay block 1300 in FIG. 13 is any one of the two fine adjustment blocks 531 and 532 as shown in FIG. 5. What distinguishes the two fine adjustment bocks 531 and 532 from each other is as follows. The signal input to the fine adjustment block 531 and the signal input to the fine adjustment block 532 are the signal CLK2 including odd-number times the delay time and the signal CLK3 including even-number times the delay time, respectively. The signal CLK2 and the signal CLK3 are controlled by the first fine control signal FCB and the second fine control signal FC, respectively. The first fine control signal FCB has the same size as the second fine control signal FC, but has the opposite phase to the second fine control signal FC. The fine adjustment delay block 1300 is now described, taking this into consideration, The fine adjustment delay block 1300 includes two inverters inv1 and inv2, and a third type tri-state inverter. The third type inverter includes a P-type inverting transistor MP1, an N-type inverting transistor, and a delay adjustment unit 1310.

The first and second inverters inv1 and inv2 buffers the input signal CLK-IN.

One terminal of the P-type inverting transistor MP1 connects to the first power source voltage VDD, and the buffered input signal CLK_MID is applied to a gate. One terminal of the N-type inverting transistor MN1 connects to the second power source voltage VSS, and the buffered input signal CLK_MID is applied to a gate.

The delay adjustment unit 1310 includes a plurality of the delay adjustment blocks 1311 through 1314. Each of the delay adjustment blocks includes the P-type MOS transistor and the N-type MOS transistor which connect in series to each other between the other terminal of the P-type inverting transistor MP1 and the other terminal of the N-Type inverting transistor MN1.

The first delay adjustment block 1311 includes the P-type MOS transistor and the N-type MOS transistor. One terminal of the P-type MOS transistor connects to the other terminal of the P-type inverting transistor MP1, and the output signal CLK-OUT is generated to the other terminal of the P-type MOS transistor. One terminal of the N-type MOS transistor connects to the other terminal of the N-type inverting transistor MN1, and the output signal CLK-OUT is generated to the other terminal of the N-type MOS transistor. Two signals CON[0] and CONB[0] which have the same amplitude and the opposite phases are applied to the gates of the two MOS transistors, respectively. Thus, the two transistors turn on at the same time, depending upon whether the first fine control signal FCB is logically HIGH or LOW, thereby enabling the tri-state inverter to operate properly. Otherwise. the two transistors turn off at the same time, thereby keeping the tri-state inverter in the high impedance state X.

Constructions of the delay adjustment blocks 1312 through 1314 are the same as those of the delay adjustment blocks which are above described. So, description of the construction of the delay adjustment blocks 1312 through 1314 is omitted.

Each of the delay adjustment blocks 1312 through 1314 is replaced with a delay component having a given turn-on resistance value. The delay blocks connects in parallel, to each other between the other terminal of the P-type inverting transistor MP1 and the other terminal of the N-type inverting transistor MN1. So, the delay time in the fine adjustment delay block 1300 can be adjusted by changing the number of the delay adjustment blocks 1312 through 1314 which normally turn on.

As shown in FIG. 5, the outputs of the two fine adjustment blocks 531 and 532 connect to each other to generate the fourth clock signal CLK4, The interpolation is applied to the outputs of the two fine adjustment blocks 531 and 532. Thus, a circuit which is equivalent to the fine block 530 as shown in FIG. 5 can be realized.

The sizes of the N-type MOS transistor and the P-type MOS transistor making up the first inverter (inv1) are the same as those of the N-type MOS transistor MN0 and the P-type MOS transistor MP0 which are used in the first type tri-state inverter and the second type tri-state inverter. This is required to make the load capacitance value of the output terminal of the odd-number multiple delay chain block the same as that of the output terminal of the even-number multiple delay chain block.

Figure 14:
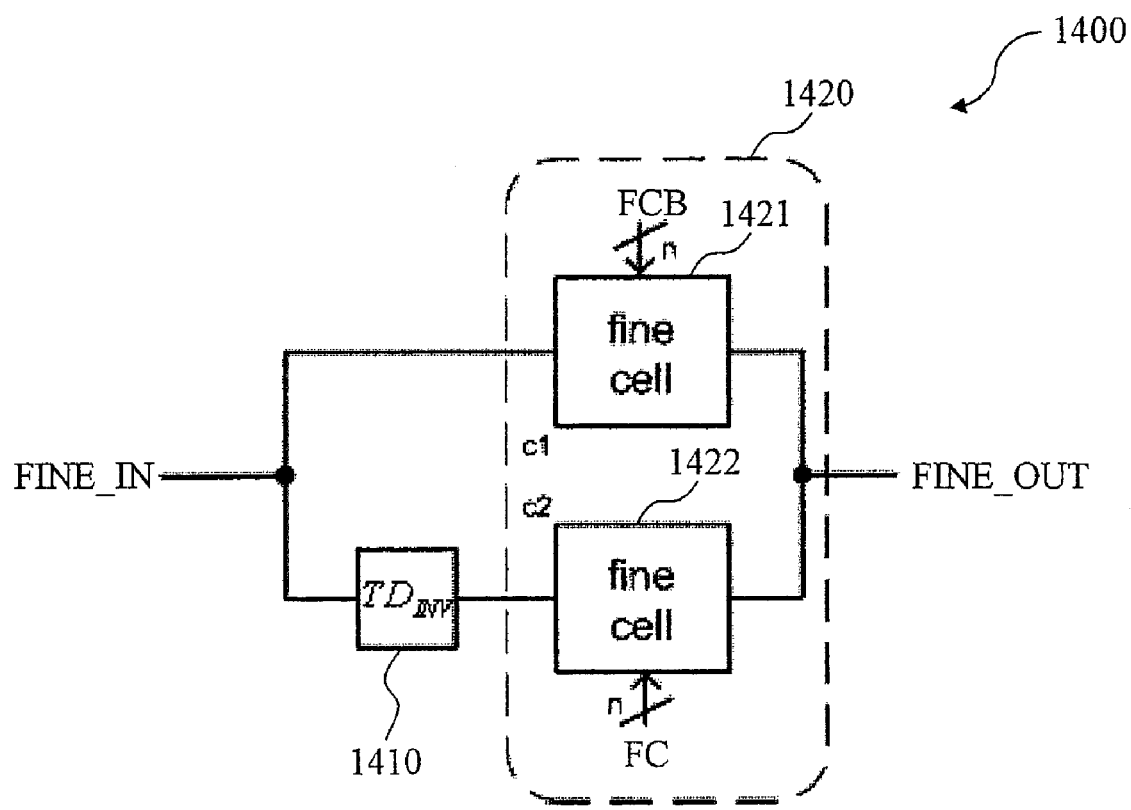
FIG. 14 is a view of the circuit which is equivalent to the fine block of FIG. 5.

FIG. 14 is a view of the circuit which is equivalent to the fine block of FIG. 5.

As shown in FIG. 14, the fine block 1400 includes a first fine cell 1421 and a second fine cell 1422. An input signal FINE_IN is transmitted directly to the first fine cell 1421, and at the same time is transmitted to the second fine cell 1422 after being delayed by the unit delay time while passing through the unit delay time block 1410. At this point, the interpolation is applied to the unit delay time block 1410, thereby adding the delay time equivalent to a difference in phase between inputs to the two fine adjustment blocks 531 and 532 as shown in FIG. 5, to the input signal FINE_IN.

Output terminals of the first and second fine cells 1421 and 1422 connect to each other to generate an output signal FINE_OUT.

The first fine cell 1421 and the second fine cell 1422 correspond to the first fine adjustment delay block 531 and the second fine adjustment delay block 532, respectively. The unit delay time block 1410 corresponds to the coarse block 520. This is later described referring to FIG. 15.

Referring to FIG. 13, each of the N-type MOS transistors, which make up the delay adjustment blocks 1311 through 1314 in the tri-state inverter, has a given ratio W/L of a width W of the gate of the N-type MOS transistor to a length L of the gate of the N-type MOS transistor. All the ratios W/L for all the N-type MOS transistors have to be the same to minimize the minimum delay time in the tri-state inverter making up the fine cell. The ratio W/L for the N-type MOS transistors, which make up the delay adjustment blocks 1311 through 1314, is obtained by multiplying a ratio W/L of a width W of a gate of an N-type MOS transistor MN1 to a length L of the gate of the N-type MOS transistor MN1, by 1/n. The number "n" is an integer, which is determined by an engineer. Also, each of the P-type MOS transistors, which make up the delay adjustment blocks 1311 through 1314 in the tri-state inverter, has a given ratio W/L of a width W of the gate of the P-type MOS transistor to a length L of the gate of the P-type MOS transistor. All the ratios W/L for all the P-type MOS transistors have to be the same to minimize the minimum delay time in the tri-state inverter making up the fine cell. The ratio W/L for the P-type MOS transistors, which make up the delay adjustment blocks 1311 through 1314, is obtained by multiplying a ratio W/L of a width W of a gate of an P-type MOS transistor MP1 to a length L of the gate of the P-type MOS transistor MP1, by 1/n.

FIG. 15 is a table showing the delay time in the odd-number multiple delay chain block and the even-number multiple delay chain block according to the coarse control code.

As shown in FIG. 15, when the coarse control code is 0 (zero), the delay time in the odd-number multiple delay chain block is one unit delay time $TD_{INV}$, and the delay time in the even-number multiple delay chain block is two times the unit delay time $TD_{INV}$. When the coarse control code is 1 (one), the delay time in the odd-number multiple delay chain block is three times the unit delay time $TD_{INV}$, and the delay time in the even-number multiple delay chain block remains two times the unit delay time $TD_{INV}$. When the coarse control code is 2 (two), the delay time in the odd-number multiple delay chain block remains three times the unit delay time $TD_{INV}$ and the delay time in the even-number multiple delay chain block is four times the unit delay time $TD_{INV}$. The unit delay time is the same as the delay time in the tri-state inverter making up the odd-number multiple delay chain block and the even-number multiple delay chain block.

When the coarse control code changes by one step, the delay time in any one of the odd-number multiple delay chain block and the even-number multiple delay chain block changes. This prevents a glitch which occurs due to a difference in the arrival time of the control code between the odd-number multiple delay chain block and the even-number multiple delay chain block.

That is, when the coarse code changes from 2 to 3, the state of the coarse A control signal driving the odd-number multiple delay chain block changes (CA[0]→CA[0], CA[1]), and the state of the coarse B control signal driving the even-number multiple delay chain block does not change (CB[0]→CB[0]). When the coarse code changes from 3 to 4, the state of the coarse A control signal driving the odd-number multiple delay chain block does not change (CA[0], CA[1]→CA[0], CA[1]), and the state of the coarse B control signal driving the even-number multiple delay chain block changes (CB[0]→CB[0], CB[1]).

The interval between the delay times in the odd-number multiple delay chain block and the even-number multiple delay chain block, which are determined depending up the control code, is always the unit delay time and is the same as the delay time in the tri-state inverter.

The coarse block can be replaced with the unit delay time $TD_{INV}$, as shown in FIG. 14, because the difference in the delay time between the odd-number multiple delay chain block and the even-number multiple delay chain block is always the unit delay time $TD_{INV}$.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A digitally controlled oscillator comprising:
a phase compensation block generating a PLL signal PLLCLK and a first clock signal CLK1 which has the same phase and frequency as the PLL signal PLLCLK, in response to a phase control signal DISABLE and a fourth clock signal CLK4;
a coarse block generating a second clock signal CLK2 and a third clock signal CLK3 which results from delaying the PLL signal PLLCLK and the first clock signal CLK1 for a given time, in response to a m(integer)-bit coarse A control signal COAR_A and an (m−1)-bit coarse B control signal COAR_B; and
a fine block generating the fourth clock signal CLK4 by applying interpolation to the second clock signal CLK2 and the third clock signal CLK3 in response to an n(integer)-bit first fine control signal FCB and a n-bit second fine control signal FC,
wherein the phase compensation block comprises:
a first NOR gate generating the PLL signal PLLCLK by performing an NOR operation on the phase control signal DISABLE and the fourth clock signal CLK4; and
a second NOR gate generating the first clock signal CLK1 by performing an NOR operation on the phase control signal DISABLE and the fourth clock signal CLK4.

2. The digitally controlled oscillator according to claim 1, wherein the coarse block comprises:
an odd-number multiple delay chain block generating a second clock signal CLK2 which results from adding odd-number times a unit delay time to the PLL signal PLLCLK in response to an m(integer)-bit coarse A control signal COAR_A; and
an even-number multiple delay chain block generating a third clock signal CLK3 which results from applying interpolation to the first clock signal CLK1 in response to an (m−1)-bit coarse B control signal COAR_B,
wherein the third clock signal CLK3 is a signal which results from adding even number times the unit delay time to the first clock signal CLK1.

3. The digitally controlled oscillator according to claim 2, wherein the odd-number multiple delay chain block comprises:
a first intermediate inverter IM11 provided between a terminal receiving the PLL signal PLLCLK and a terminal outputting the second clock signal CLK2;
a first odd-number multiple delay chain circuit comprising a first left inverter IL11, a second intermediate inverter IM12 and a first right inverter IR11 which connect in series to each other between the input and output terminals of the first intermediate inverter IM11;
a second odd-number multiple delay chain circuit comprising a second left inverter IL12, a third intermediate inverter IM13 and a second right inverter IR12 which connect in series to each other between the input and output terminals of the second intermediate inverter IM12;
an m th odd-number multiple delay chain circuit comprising an m th left inverter IL1m, an (m+1)th intermediate inverter IM1(m+1) and an m th right inverter IR1m which connect in series to each other between the input and output terminals of the m th intermediate inverter IM1m; and
a closing delay chain circuit comprising an (m+1)th left inverter IL1(m+1) and an (m+1)th right inverter IR1(m+1) which connect in series to each other between the input and output terminals of an (m+1) th intermediate inverter IM1(m+1),
wherein the m th intermediate inverter IM1m operates in response to an (m−1)th coarse A reverse control signal COAR_AB[m−1], the m th left inverter IL1m operates in response to an (m−1)th coarse A control signal COAR_A[m−1], the m th right inverter IR1m operates in response to the (m−1)th coarse A control signal COAR_A[m−1], and the all inverters are first type tri-state inverters.

4. The digitally controlled oscillator according to claim 3, wherein the first-type tri-state inverter operating in response to a 0 th control signal C0 comprises:
a P-type inverting transistor MPO whose one terminal connects to a first power source voltage VDD and an input signal IN is applied to a gate terminal;
an N-type inverting transistors MNO whose one terminal connects to a second power source voltage VSS and the input signal IN is applied to a gate terminal; and
a delay adjustment unit connecting between the other terminal of the P-type inverting transistor MPO and the other terminal of the N-type inverting transistor MNO, adjusting the delay time in the first type tri-state inverter in response to one control signal C0.

5. The digitally controlled oscillator according to claim 4, wherein the delay adjustment unit comprises:
a first P-type delay adjustment transistor MP1 whose one terminal connects to the other terminal of the P-type inverting transistor MPO and whose the other terminal connects to an output terminal outputting an output signal OUT, a 0 th reverse control signal C0B being applied to a gate;
a second P-type delay adjustment transistor MP2 whose one terminal connects to the other terminal of the P-type inverting transistor MPO and whose the other terminal connects to the output terminal outputting the output signal OUT, the 0 th reverse control signal C0B being applied to a gate;
a first N-type delay adjustment transistor MN1 whose one terminal connects to the other terminal of the N-type inverting transistor MNO and whose the other terminal connects to the output terminal outputting the output signal OUT, the 0 th control signal C0 being applied to a gate; and
a second N-type delay adjustment transistor MN2 whose one terminal connects to the other terminal of the N-type inverting transistor MNO, and whose the other terminal connects to the output terminal outputting the output signal OUT, the 0 th control signal C0 being applied to a gate,
wherein the 0 th reverse control signal C0B has the same amplitude as the 0 th control signal C0, but has the opposite phase to the 0 th control signal C0.

6. The digitally controlled oscillator according to claim 2, wherein the even-number multiple delay chain block comprising:
- a first intermediate inverter IM21 provided between a terminal receiving the first clock signal CLK1 and a terminal outputting the third clock signal CLK3;
- a first even-number multiple delay chain circuit, comprising a first left inverter IL21, a second intermediate inverter IM22 and a first right inverter IR21 which connect in series to each other between the input and output terminals of the first intermediate inverter IM21;
- a second even-number multiple delay chain circuit comprising a second left inverter IL22, a third intermediate inverter IM23 and a second right inverter IR22 which connect in series to each other between the input and output terminals of the second intermediate inverter IM22;
- an m th even-number multiple delay chain circuit comprising an m th left inverter IL2m, an (m+1)th intermediate inverter IM2(m+1) and an m th right inverter IR2m which connect in series to each other between the input and output terminals of an m th intermediate inverter IM2m; and
- a closing delay chain circuit comprising an (m+1)th left inverter IL2(m+1) and an (m+1)th right inverter IR2(m+1) which connect in series to each other between the input and output terminals of an (m+1) th intermediate inverter IM2(m+1),
- wherein the first intermediate inverter IM21 operates in response to the 0 th coarse B reverse control signal COAR_BB[0] and the second power source voltage VSS, the second intermediate inverter IM22 operates in response to the first coarse B reverse control signal COAR_BB[1] and the 0 th coarse B reverse control signal COAR_BB[0], the (m−1) intermediate inverter IM2(m−1) operates in response to an (m−2) th coarse B reverse control signal COAR_BB[m−2] and an (m−3) coarse B reverse control signal COAR_BB[m−3], the m th intermediate inverter IM2m operates in response to the first power source voltage VDD and an (m−2) coarse B reverse control signal COAR_BB[m−2], and the (m+1) intermediate inverter IM2(m+1) operates in response to the first power source voltage VDD and the first power voltage VDD,
- wherein the first left inverter IL21 operates in response to the first power source voltage VDD, the second through m th left inverters IL22 through IL2m operate in response to the 0 th through (m−2) th coarse B control signals COAR_B[0] through COAR_B[m−2], respectively, and the (m+1) left inverter IL2(m+1) operates in response to the second power source voltage VSS,
- wherein the first right inverter IR21 operates in response to the first power source VDD and the 0 th coarse B control signal COAR_B[0], the second right inverter IR22 operates in response to the 0 th coarse B control signal COAR_B[0] and the first coarse B control signal COAR_B[1], the (m−1)th right inverter IR2(m−1) operates in response to an (m−3)th coarse B control signal COAR_B[m−3] and an (m−2)coarse B control signal COAR_B[m−2], the m th right inverter IR2m operates in response to an (m−2)th coarse B control signal COAR_B[m−2] and the second power source voltage VSS, and the (m+1)th right inverter IR2(m+1) operates in response to the second power source VSS and the second power source VSS, and
- wherein all the inverters are the second type tri-state inverters.

7. The digitally controlled oscillator according to claim 6, wherein the second type tri-state inverter operating in response to two control signals comprises:
- a P-type inverting transistor MPO whose one terminal connects to the first power source voltage VDD, an input signal IN being applied to a gate;
- a N-type inverting transistor MNO whose one terminal connects to the second power source voltage VSS, the input signal IN being applied to a gate; and
- a delay adjustment unit 711 connecting between the other terminal of the P-type inverting transistor MPO and the other terminal of the N-type inverting transistor MNO, adjusting the delay time in the second type tri-state inverter in response to two control signals C1 and C2.

8. The digitally controlled oscillator according to claim 7, wherein the delay adjustment unit comprises:
- a first P-type delay adjustment transistor MP1 whose one terminal connects to the other terminal of the P-type inverting transistor MPO and whose the other terminal connects to an output terminal outputting an output signal OUT, a first reverse control signal C1B being applied to a gate;
- a second P-type delay adjustment transistor MP2 whose one terminal connects to the other terminal of the P-type inverting transistor MPO and whose the other terminal connects to the output terminal outputting the output signal OUT, a second reverse control signal C2B being applied to a gate
- a first N-type delay adjustment transistor MN1 whose one terminal connects to the other terminal of the N-type inverting transistor MNO and whose the other terminal connects to the output terminal outputting the output signal OUT, a first control signal C1 being applied to a gate; and
- a second N-type delay adjustment transistor MN2 whose one terminal connects to the other terminal of the N-type inverting transistor MNO, and whose the other terminal connects to the output terminal outputting the output signal OUT, a second control signal C2 being applied to a gate,
- wherein the first reverse control signal C1B has the same amplitude as the first control signal C1, but has the opposite phase to the first control signal C1, and the second reverse control signal C2B has the same amplitude as the second control signal C2, but has the opposite phase to the second control signal C2.

9. The digitally controlled oscillator according to claim 1, wherein the fine block comprises:
- a first fine adjustment delay block delaying the second clock signal CLK2 for a given time in response to the first fine control signal FCB; and
- a second fine adjustment block delaying the third clock signal CLK3 for a given time in response to the second fine control signal FC,
- wherein output terminals of the first fine adjustment delay block and the second fine adjustment delay block connects to each other to generate the fourth clock signal CLK4.

10. The digitally controlled oscillator according to claim 2, wherein a state of the coarse B control signal COAR_B does not change when a state of the coarse A control signal COAR_A changes, and the state of the coarse A control signal COAR_A does not change when the state of the coarse B control signal COAR_B changes.

* * * * *